(12) United States Patent
Lin et al.

(10) Patent No.: US 10,679,989 B2
(45) Date of Patent: Jun. 9, 2020

(54) ENLARGING SPACER THICKNESS BY FORMING A DIELECTRIC LAYER OVER A RECESSED INTERLAYER DIELECTRIC

(71) Applicant: Taiwan Semiconductor Manufacturing Co., Ltd., Hsin-Chu (TW)

(72) Inventors: Chih-Han Lin, Hsinchu (TW); Che-Cheng Chang, New Taipei (TW); Horng-Huei Tseng, HsinChu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/166,762

(22) Filed: Oct. 22, 2018

(65) Prior Publication Data

US 2019/0057964 A1 Feb. 21, 2019

Related U.S. Application Data

(62) Division of application No. 15/063,907, filed on Mar. 8, 2016, now Pat. No. 10,109,627.

(51) Int. Cl.
*H01L 27/088* (2006.01)
*H01L 21/8234* (2006.01)

(52) U.S. Cl.
CPC .. *H01L 27/0886* (2013.01); *H01L 21/823431* (2013.01); *H01L 21/823468* (2013.01); *H01L 21/823475* (2013.01); *H01L 21/823425* (2013.01); *H01L 27/088* (2013.01)

(58) Field of Classification Search
None
See application file for complete search history.

(56) References Cited

U.S. PATENT DOCUMENTS

| 5,188,987 | A | 2/1993 | Ogino |
| 5,516,729 | A * | 5/1996 | Dawson ............ H01L 21/31053 |
| | | | 257/E21.244 |
| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |

(Continued)

*Primary Examiner* — Steven B Gauthier
(74) *Attorney, Agent, or Firm* — Haynes and Boone, LLP

(57) ABSTRACT

An exemplary semiconductor device includes first spacers disposed along sidewalls of a first gate structure and second spacers disposed along sidewalls of a second gate structure. A source/drain region is disposed between the first gate structure and the second gate structure. A first ILD layer is disposed between the first spacers and the second spacers. A portion of the first ILD layer has a first recessed upper surface. A dielectric layer is disposed over the first spacers, the second spacers, and the first recessed upper surface of the first ILD layer. A portion of the dielectric layer has a second recessed upper surface that is disposed over the portion of the first ILD layer having the first recessed upper surface. A second ILD layer is disposed over the dielectric layer. A contact extends through the second ILD layer, the dielectric layer, and the first ILD layer to the source/drain region.

20 Claims, 9 Drawing Sheets

(56) References Cited

U.S. PATENT DOCUMENTS

| | | |
|---|---|---|
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,753,931 B2 | 6/2014 | Zhu et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 2009/0286384 A1* | 11/2009 | Wu .................. H01L 21/76229 438/584 |
| 2012/0001263 A1* | 1/2012 | Richter ............ H01L 21/31053 257/368 |
| 2012/0104509 A1* | 5/2012 | Matsumoto ..... H01L 21/823814 257/369 |
| 2014/0001574 A1 | 1/2014 | Chen et al. |
| 2014/0110755 A1 | 4/2014 | Colinge |
| 2014/0151812 A1 | 6/2014 | Liaw |
| 2014/0231924 A1* | 8/2014 | Kuo ..................... H01L 29/785 257/401 |
| 2016/0268125 A1* | 9/2016 | Li ..................... H01L 21/31051 |

\* cited by examiner

… …

ENLARGING SPACER THICKNESS BY FORMING A DIELECTRIC LAYER OVER A RECESSED INTERLAYER DIELECTRIC

The present application is a divisional application of U.S. patent application Ser. No. 15/063,907, filed Mar. 8, 2016, now U.S. Pat. No. 10,109,627, which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The ever-shrinking geometry size brings challenges to semiconductor fabrication. For example, misalignment between microelectronic components (such as misalignment between a source/drain and a conductive contact formed thereover) during fabrication may occur, which may damage the semiconductor device or degrade its performance. In addition, the smaller device sizes may lead to more significant parasitic capacitance, which could also negatively affect semiconductor device performance.

Therefore, while existing semiconductor devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
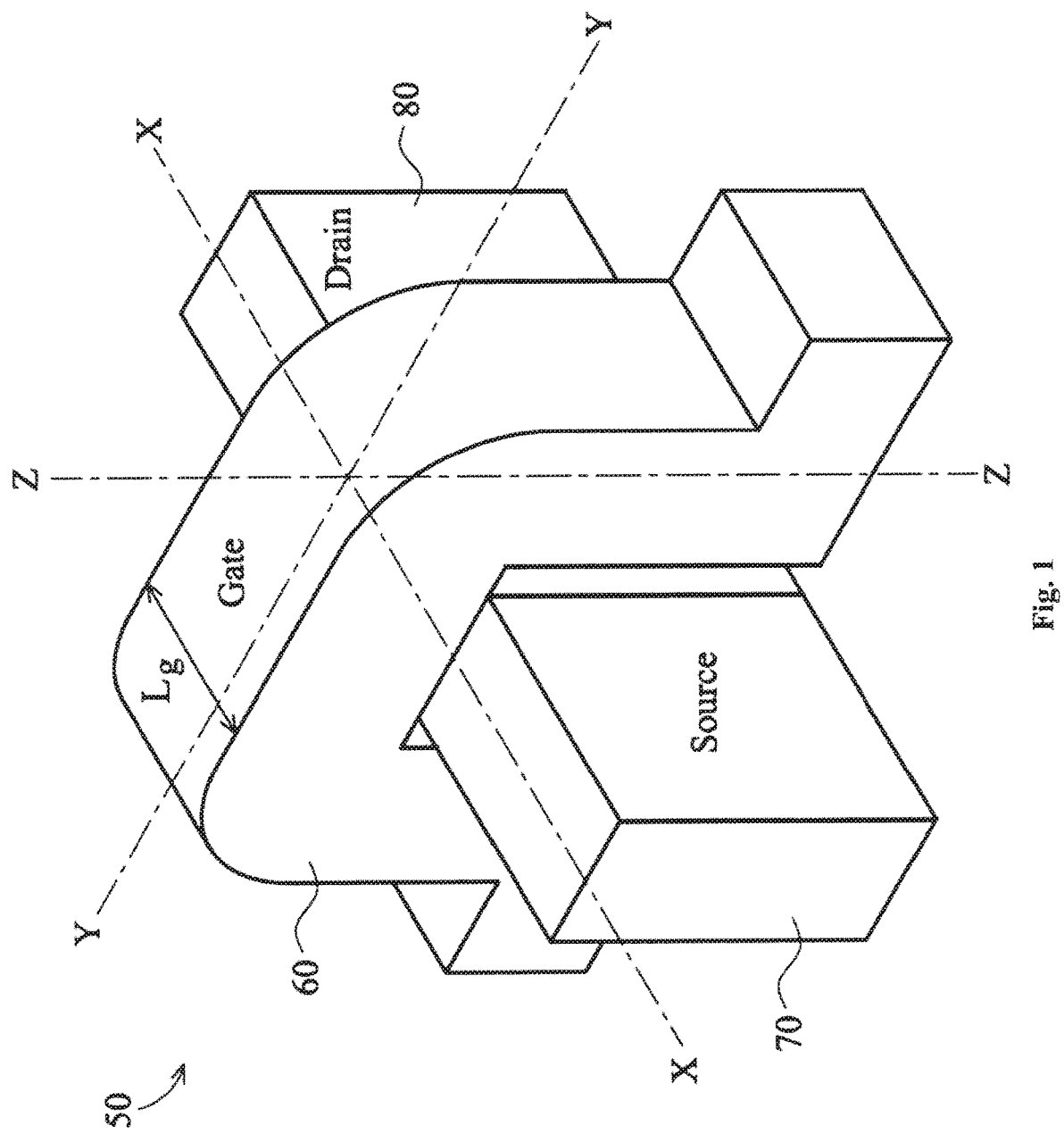
FIG. 1 is a perspective view of an example semiconductor device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The use of FinFET devices has been gaining popularity in the semiconductor industry. A FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. In a typical FinFET device, a gate wraps around a fin structure, in which the source and drain are formed. However, due at least in part to the narrowness of the fin structure, it may be challenging to align the source/drain with a conductive source/drain contact hole to be formed thereabove. A lateral shift of the source/drain contact hole (i.e., misalignment) may inadvertently damage the gate, as the etching process used to form the source/drain contact hole may cause the gate to be undesirably etched as well.

To improve the alignment between the source/drain contact with the source/drain, the present disclosure forms a recessed dielectric layer that effectively serves as an "extra gate spacer". This "extra gate spacer" protects the gate from being inadvertently etched. The various aspects of the present disclosure are discussed below with reference to FIGS. 1-9. It is understood that the following disclosure will continue with one or more FinFET examples to illustrate various embodiments of the present invention. It is understood, however, that the application should not be limited to a particular type of device, except as specifically claimed.

Referring to FIG. 1, a perspective view of an example FinFET device 50 is illustrated. The FinFET device 50 is a non-planar multi-gate transistor that is built on a substrate. A thin silicon "fin-like" structure (referred to as fin) forms the body of the FinFET device 50. A gate 60 of the FinFET device 50 is wrapped around this fin. Lg denotes a length (or width, depending on the perspective) of the gate 60. A source 70 and a drain 80 of the FinFET device 50 are formed in extensions of the fin on opposite sides of the gate 60. The fin itself serves as a channel. The effective channel length of the FinFET device 50 is determined by the dimensions of the fin.

FinFET devices offer several advantages over traditional Metal-Oxide Semiconductor Field Effect Transistor (MOS- FET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

Figure 2:
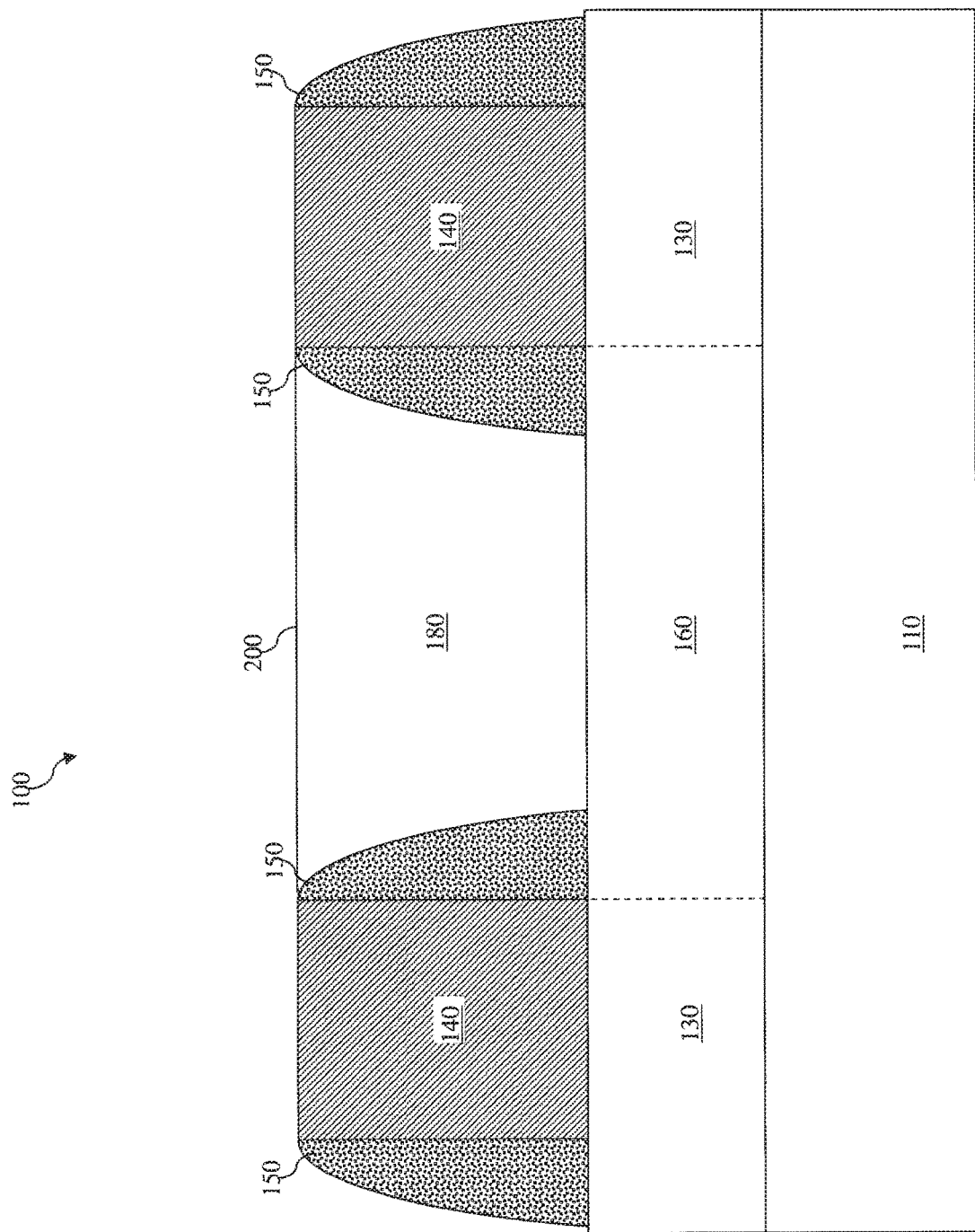
FIGS. 2-8 are different cross-sectional side views of a semiconductor device according to various embodiments of the present disclosure.

Referring now to FIG. 2, a semiconductor device 100 is illustrated. The semiconductor device 100 shown in FIG. 2 is a diagrammatic cross-sectional side view of a FinFET device taken along the X-Z plane of FIG. 1. The semiconductor device 100 includes a substrate 110. In an embodiment, the substrate 110 includes a dielectric material, for example silicon oxide ($SiO_2$). In other embodiments, the substrate 110 may include another suitable material, for example a semiconductor material.

A semiconductor layer 130 is formed on the substrate 110. In an embodiment, the semiconductor layer 130 includes a crystal silicon material. It is understood that the semiconductor layer 130 may include other suitable materials in alternative embodiments. An implantation process may be performed to implant a plurality of dopant ions to the semiconductor layer 130. The dopant ions may include an n-type material in some embodiments, for example arsenic (As) or phosphorous (P), or they may include a p-type material in some other embodiments, for example boron (B), depending on whether an NMOS or a PMOS is needed. After the implantation process is performed, a doping concentration level in the semiconductor layer 130 is in a range from about $1\times10^{17}$ ions/$cm^3$ to about $5\times10^{19}$ ions/$cm^3$ in some embodiments. In other embodiments, the doping concentration levels and the thickness of the substrate may be different.

The semiconductor layer 130 is patterned to form a fin structure (e.g., the fin structure shown in FIG. 1). The fin structure extends in an elongate manner along the X direction. As discussed previously, a portion of the fin structure will serve as a conductive channel for the semiconductor device 100, and another portion of the fin structure will serve as the source/drain region of the semiconductor device 100.

The semiconductor device 100 includes gate structures 140. The gate structures 140 are formed to wrap around the fin structure in the manner as shown in FIG. 1. However, since FIG. 2 illustrates the cross-sectional side view of the FinFET device taken across the X-Z plane (i.e., cutting the FinFET device on the fin structure), only a portion of each of the gate structures 140 is shown. That is, FIG. 2 shows the portion of the gate structures 140 disposed over the fin structure, but not the portion of the gate structures 140 disposed beside the fin structure.

Each gate structure 140 includes a respective gate dielectric layer that is formed around the fin structure and a gate electrode layer that is formed on the gate dielectric layer. The gate dielectric layer and the gate electrode layer may each be formed using a deposition process known in the art, for example chemical vapor deposition (CVD), physical vapor deposition (PVD), atomic layer deposition (ALD), combinations thereof, or another suitable process.

In some embodiments, the gate structures 140 are high-k metal gate structures. In these embodiments, the gate dielectric layer contains a high-k dielectric material. A high-k dielectric material is a material having a dielectric constant that is greater than a dielectric constant of $SiO_2$, which is approximately 4. In an embodiment, the gate dielectric layer contains hafnium oxide ($HfO_2$), which has a dielectric constant that is in a range from approximately 18 to approximately 40. In alternative embodiments, the gate dielectric layer may contain one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO. The gate electrode layer contains a metal or metal compound. For example, the gate electrode layer may contain titanium nitride (TiN) material, tungsten (W), tungsten nitride (WN), or tungsten aluminum (WAl), aluminum (Al), titanium (Ti), copper (Cu), or combinations thereof.

The formation of the high-k metal gate may involve a gate replacement process flow. In one embodiment of the gate replacement process flow, a dummy gate electrode layer (e.g., containing polysilicon) is formed on a high-k gate dielectric layer. After ion implantation processes are performed to form the source and drain regions (discussed below in more detail), the dummy gate electrode layer is removed, and then a metal gate electrode layer is formed in place of the dummy gate electrode layer. This gate replacement process flow may be referred to as a gate-last process flow. In another embodiment of the gate replacement process flow, a dummy gate dielectric layer (e.g., containing silicon oxide) is formed, and the dummy gate electrode layer is formed over the dummy gate dielectric layer. After ion implantation processes are performed to form the source and drain regions, the dummy gate dielectric layer and the dummy gate electrode layer are both removed. A high-k gate dielectric layer is formed to replace the dummy gate dielectric layer, and a metal gate electrode layer is formed to replace the dummy gate electrode layer. This gate replacement process flow may be referred to as a high-k-last process flow. As an example, the details of forming high-k metal gate structures are described in more detail in U.S. patent application Ser. No. 13/440,848, filed on Apr. 5, 2012, entitled "Cost-effective gate replacement process" to Zhu et al., which is issued as U.S. Pat. No. 8,753,931 on Jun. 17, 2014, the disclosure of which is hereby incorporated by reference in its entirety.

Gate spacers 150 are formed on sidewall surfaces of the gate structures 140. The gate spacers 150 are formed by depositing a spacer material over the gate structures 140 and thereafter performing a patterning process (for example an etching process) on the spacer material. The spacer material may include a dielectric material. In an embodiment, the spacer material includes silicon oxide. In another embodiment, the spacer material includes silicon nitride.

Still referring to FIG. 2, a channel region is disposed below each of the gate structures 140 in a portion of the semiconductor layer 130. A source/drain region 160 is formed in another portion of the semiconductor layer 130, between the gate structures 140. Alternatively stated, source/drain regions 160 (one of which is shown in FIG. 2) are formed on opposite sides of each of the gate structures 140. In some embodiments, the source/drain region 160 may include a lightly doped source/drain region and a heavily doped source/drain region. The lightly doped source/drain region may be formed by an ion implantation process in which dopant ions are implanted into the portion of the fin structure located on either side (or opposite sides) of the gate structures 140. The ion implantation process used to form the lightly doped source/drain region is performed before the gate spacers 150 are formed. After the formation of the gate spacers, another ion implantation process is performed to implant dopant ions into the portion of the fin structure not protected by the gate structures 140 or the gate spacers 150. This ion implantation process forms the heavily doped source/drain regions, which have a greater dopant concentration level than the lightly-doped source/drain regions.

The semiconductor device 100 also includes an interlayer dielectric (ILD) 180. In the embodiment illustrated in FIG. 2, the ILD 180 is disposed laterally adjacent to the gate spacers 150 and vertically above the source/drain region 160. In some embodiments, the ILD 180 contains a low-k dielectric material (dielectric constant smaller than that of silicon oxide). For example, the low-k dielectric material may include fluorine-doped silicon dioxide, carbon-doped silicon dioxide, porous silicon dioxide, porous carbon-doped silicon dioxide, or a spin-on polymeric dielectric material. As is shown in FIG. 2, the ILD 180 has a planar (or flat) upper surface 200 that is co-planar with the upper surface of the gate structures 140.

Figure 3:
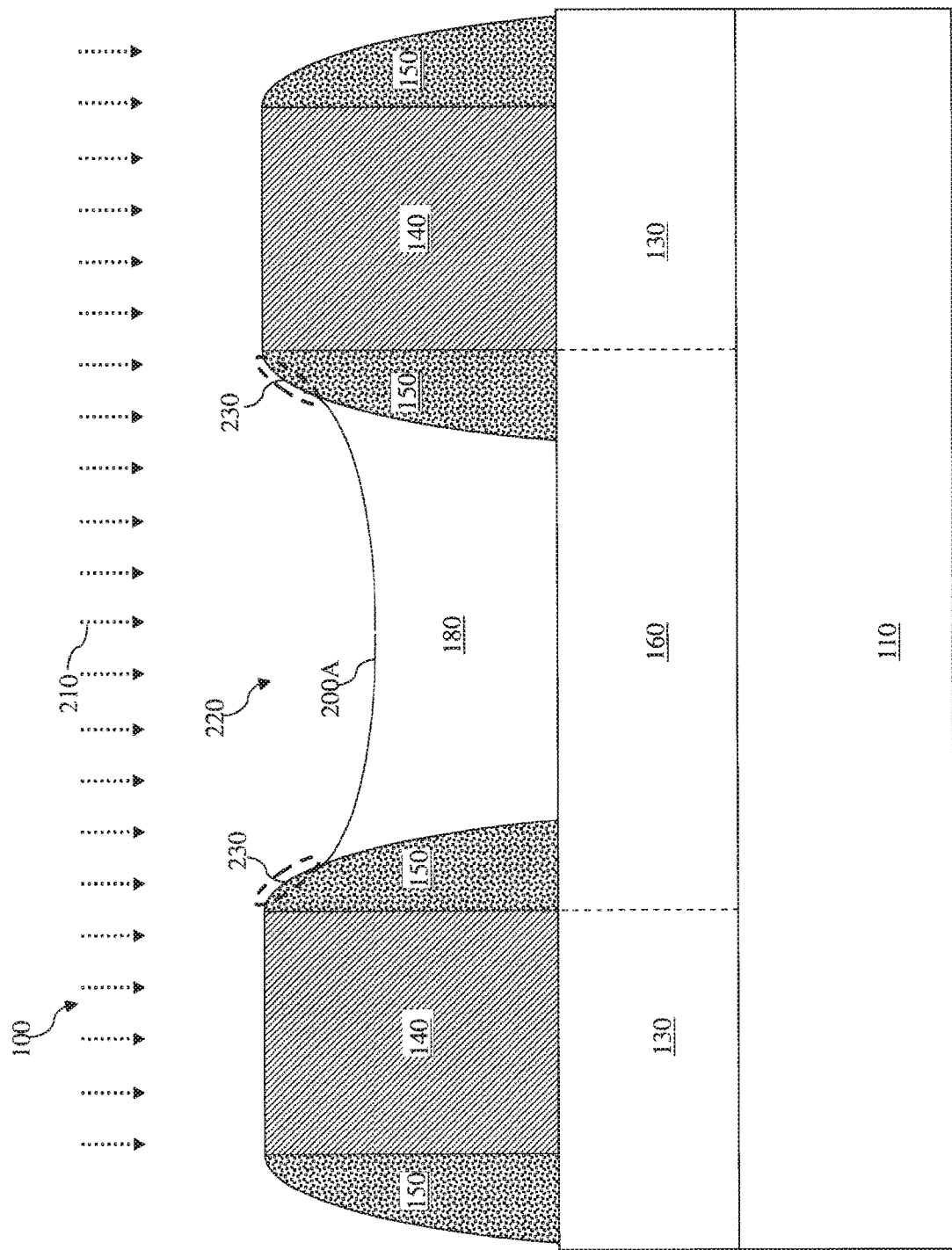

Referring now to FIG. 3, a process 210 is performed to the semiconductor device 100 to form a recess 220 in the upper surface 200 of the ILD. In some embodiments, the process 210 includes one or more etching processes. The etching processes may include a wet etching process, a dry etching process, or a combination thereof. The one or more etching processes are configured to etch away the material of the ILD 180 without substantially etching away the materials of the gate structures 140 or the gate spacers 150. For example, this may be done by configuring the etchant to have a substantially higher etching rate with respect to the material of the ILD 180 than with respect to the materials of the gate structures 140 or the gate spacers 150.

In some other embodiments, the process 210 includes one or more polishing processes such as a chemical mechanical polishing (CMP) process. The CMP process uses a carefully-tuned slurry that is different from the slurries in conventional CMP processes, so that the material of the ILD 180 is polished away at a faster rate than the materials of the gate structures 140 or the materials of the gate spacers 150.

Regardless of how the process 210 is implemented, the result is that the partial removal of the ILD 180 causes an opening 220 to be formed over the ILD 180. Or stated differently, the ILD 180 is "caved in" and has a recessed upper surface 200A. The recessed upper surface 200A slopes downward (toward the substrate 110). The recessed upper surface 200A may also have a downward curvature in some embodiments. In some embodiments, the removal of the ILD 180 causes an upper portion of the gate spacers 150 to be exposed to be opening 220. In other words, the gate spacers 150 (that are disposed next to the ILD 180) each have a portion 230 of a sidewall surface that is exposed.

It is understood that according to conventional semiconductor fabrication, the process 210 would not have been performed. The process 210 is performed according to the various aspects of the present disclosure in order to allow a subsequently formed dielectric layer to effectively enlarge the thickness of the gate spacers 150, as discussed below in more detail.

Figure 4:
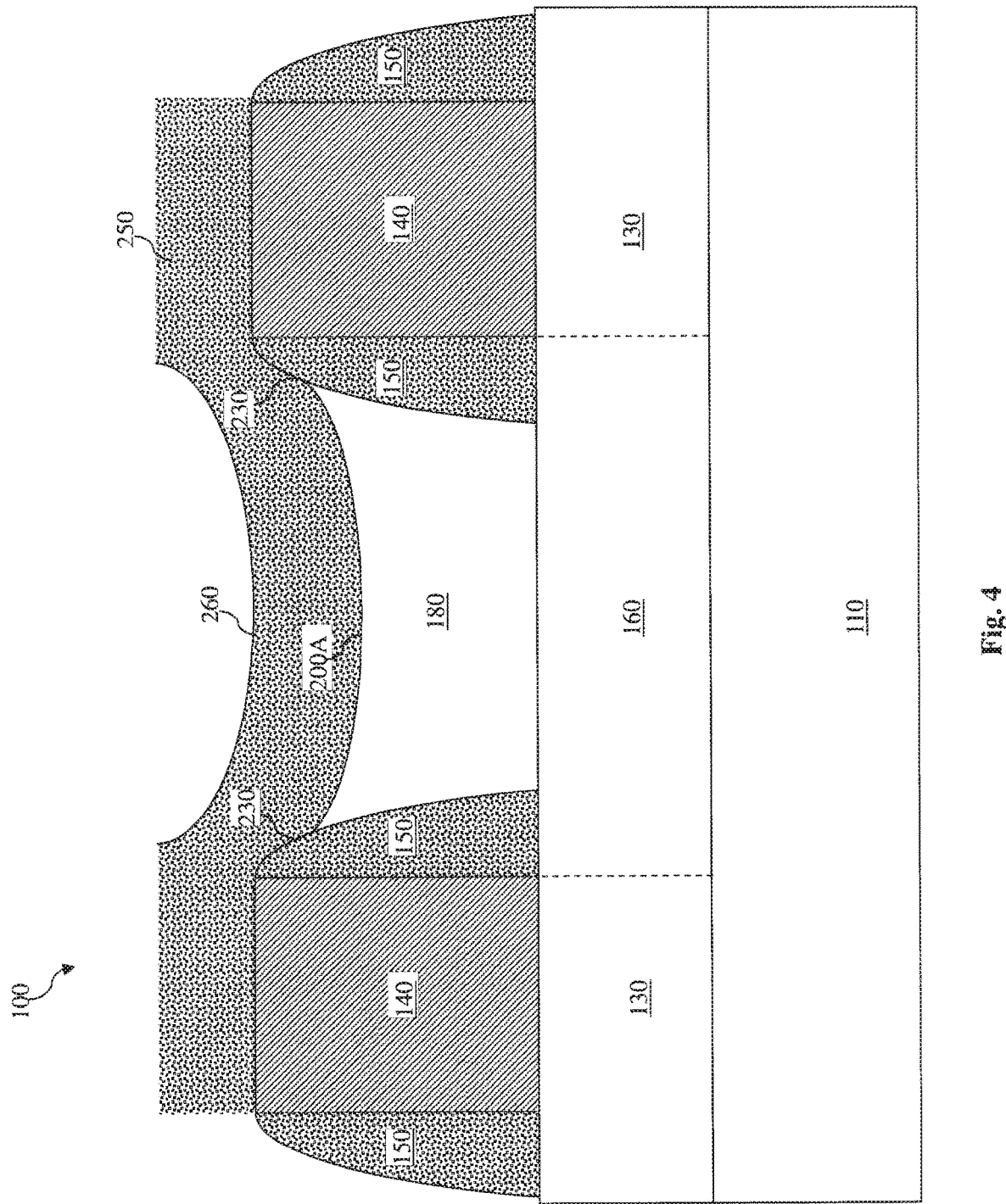

Referring now to FIG. 4, a dielectric layer 250 is formed over the gate structures 140 and over the ILD 180. The dielectric layer 250 at least partially fills the opening 220 and is in direct physical contact with the ILD 180 and the portions 230 of the upper sidewall surfaces of the gate spacers 150. In some embodiment, the dielectric layer 250 is formed by a conformal deposition process, and as a result, an upper surface 260 of the dielectric layer 250 partially assumes the recessed shape or profile of the recessed upper surface 200A of the ILD 180. In other words, the dielectric layer 250 is also formed to have a recessed upper surface 260. This allows portions of the dielectric layer 250 to be laterally disposed on the portions 230 of the sidewalls of the gate spacers 150. In some embodiments, the dielectric layer 250 is an etching-stop layer (ESL) and has a different material composition than the ILD 180. The dielectric layer 250 may or may not have the same material composition as the gate spacers 150. In some embodiments, the dielectric layer 250 contains silicon nitride.

Figure 5:
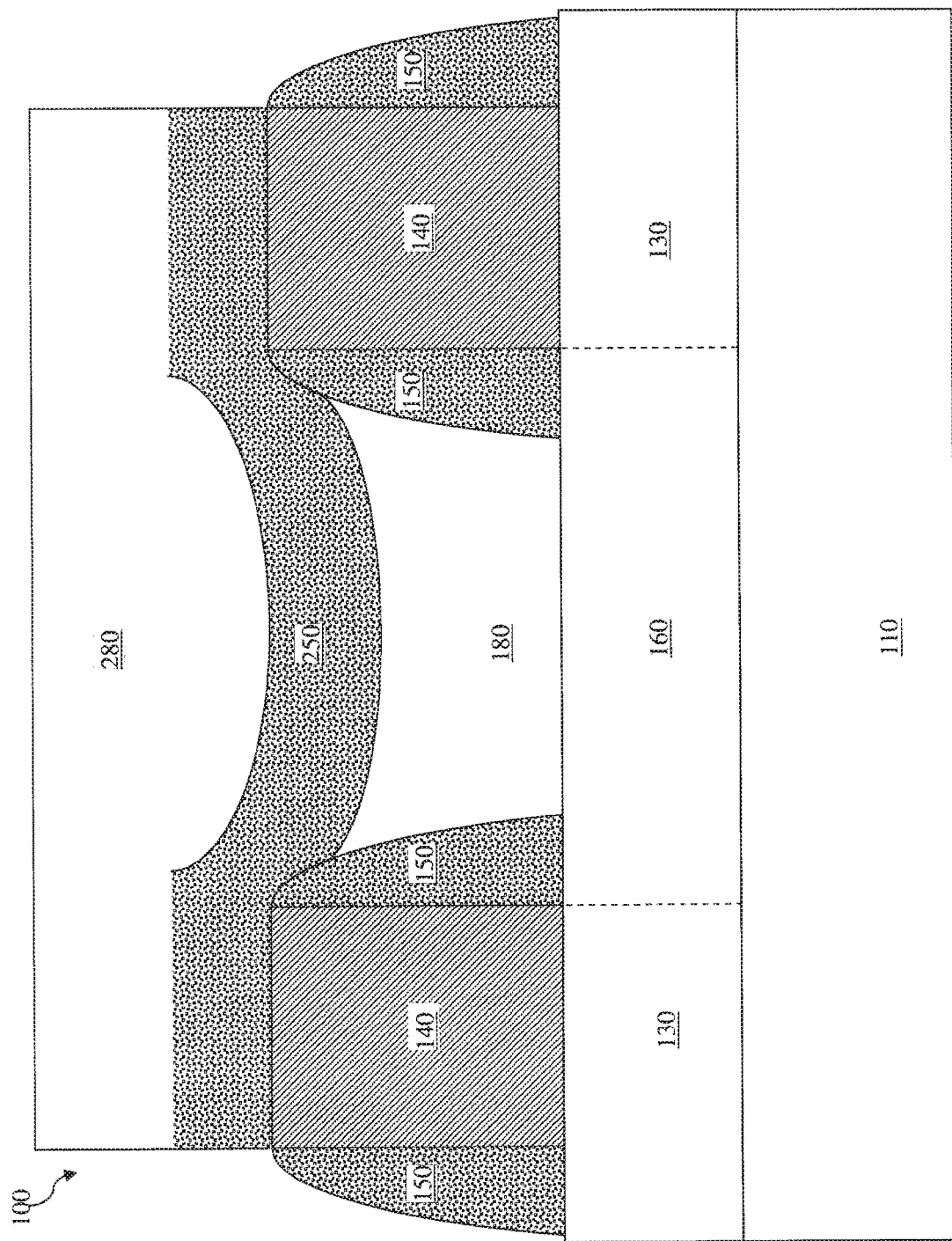

Referring now to FIG. 5, another dielectric layer 280 is formed over the dielectric layer 250. The dielectric layer 280 may be formed by a suitable deposition process. The dielectric layer 280 is also considered an interlayer dielectric (ILD) and may be referred to as ILD 280 hereinafter. In some embodiments, the ILD 280 and the ILD 180 have the same material compositions, for example they may both contain a low-k dielectric material. However, the ILD 280 and the dielectric layer 250 have different material compositions.

Figure 6:
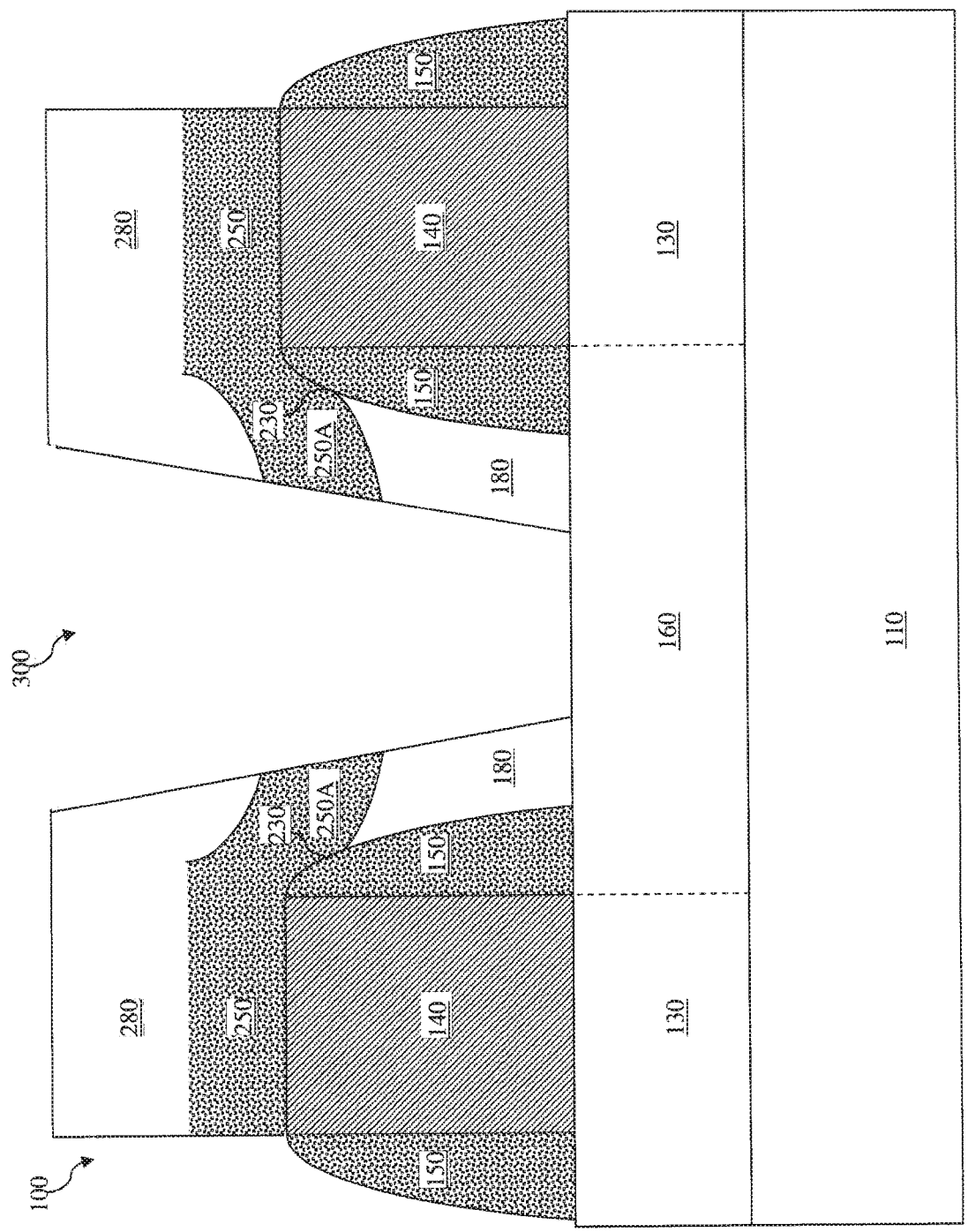

Referring now to FIG. 6, a contact hole 300 is formed using various etching processes. The contact hole 300 extends vertically through the ILD 280, the dielectric layer 250, and the ILD 180. The contact hole 300 exposes a portion of the source/drain region 160. During the etching of the contact hole 300, a portion 250A of the dielectric layer 250 effectively serves as an extra gate spacer to protect the gate structures 140 from being damaged. In more detail, since the dielectric layer 250 is formed on the recessed upper surface 200A (see FIG. 4) of the ILD 180, the dielectric layer 250 assumes the recessed shape/profile of the upper surface 200A of the ILD 180, and a portion 250A of the dielectric layer 250 disposed directly on the portion 230 of the sidewall of each of the gate spacers 150. The portion 250A of the dielectric layer 250 effectively "thickens" the gate spacers 150. Alternatively stated, the gate spacers 150 may be viewed as having an increased lateral thickness at the top portions.

During the etching of the contact hole 300, a lateral shift may occur. In more detail, the contact hole 300 may shift laterally toward either of the gate structures 140. This is undesirable, because as the contact hole 300 shifts too close to either of the gate structure 140s, the gate spacer 150 of that gate structure 140 may be "punched through." In other word, enough of the gate spacers 150 may be etched away (due to the lateral shift of the contact hole 300), so that they can no longer protect the gate structure 140 from being etched. As a result, the gate structure 140 may be damaged by the etching performed to form the contact hole 300. However, since the portions 250A of the dielectric layer 250 effectively "thickens" the gate spacers 150, the "punch-through" of the gate spacers 150 is more difficult. Stated differently, even if the contact hole 300 is undesirably shifted laterally toward either of the gate structures 140, the effectively "thicker" gate spacer 150 can more adequately prevent itself from being "punched through", and thus the gate spacers 150 can better protect the gate structures 140 from being inadvertently damaged during the formation of the contact hole 300.

Note that this would not have been possible if the ILD 180 had not been formed to have a recessed upper surface. Had the ILD 180 been left alone with a planar/flat upper surface 200 as shown in FIG. 2, the subsequent formation of the dielectric layer 250 thereon would have been over (or above) the gate spacers 150. In other words, no portion of the dielectric layer 250 would have been formed on the sidewalls of the gate spacers 150, and as such, the gate spacers 150 would not have had the increased lateral thickness as they do according to the present disclosure.

Figure 7:
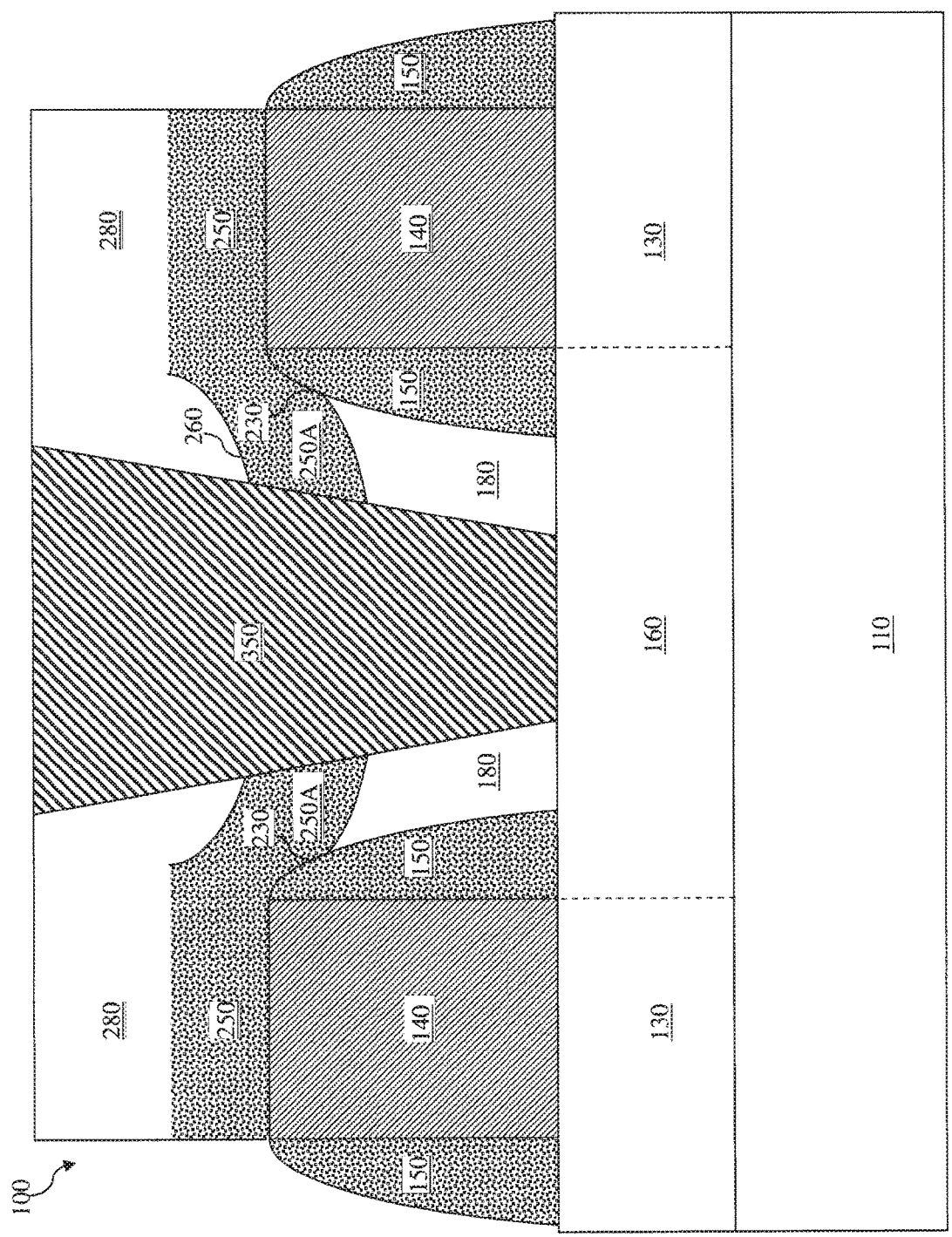

Referring now to FIG. 7, a source/drain contact 350 is formed in the contact hole 300. The source/drain contact 350 may be formed by filling the contact hole 300 with a conductive material, for example via a deposition process, and then polishing away the excess portions of the conductive material outside the contact hole 300. The remaining portion of the conductive material forms the source/drain contact 350. In some embodiments, the source/drain contact 350 contains tungsten. In other embodiments, the source/drain contact 350 contains aluminum or copper. The source/drain contact 350 is electrically coupled to the source/drain 160 (e.g., through physical contact) and provides electrical connectivity to the source/drain 160.

Since the source/drain contact 350 and the gate electrode of the structure 140 are both conductive, and since the materials disposed therebetween (e.g., the ILD 180 and the gate spacers 150) are dielectric, this leads to parasitic capacitance, as capacitance arises when a dielectric material is disposed between two conductive plates. Capacitance is inversely correlated to a distance between the two conductive plates. In other words, as the distance increases between the two conductive plates, capacitance decreases; as the distance decreases between the two conductive plates, capacitance increases. In a conventionally fabricated semiconductor device, the lateral shift of the source/drain contact hole decreases the distance between the two conductive plates (i.e., the source/drain contact 350 and the gate structure 140). The gate spacer 150 may help prevent the source/drain contact hole from being etched too close to the gate structure 140, but since the gate spacer 150 is thin (especially at the top), this may not be sufficient. Consequently, parasitic capacitance arising from the source/drain contact 350 being formed too close (i.e., small distance) to the gate structure 140 may become significant, especially as semiconductor device sizes get smaller with each technology generation. This parasitic capacitance adversely affects semiconductor device performance.

In comparison, the present disclosure reduces the parasitic capacitance by effectively "enlarging" the spacers 150 with the portions 250A of the dielectric layer 250 disposed on the sidewalls 230 of the spacers 150. Due to the "enlarged" or "thicker" spacers 150, it is more difficult for the source/drain contact hole to punch it through. In other words, the source/drain contact hole is formed in a more self-aligned manner (i.e., better vertically aligned with the source/drain region 160). Thus, the effective distance between the source/drain contact 350 and the gate electrode of the gate structure 140 is increased, compared to a scenario in prior fabrication where lateral shift of the source/drain contact made such distance too small.

It is understood that the amount or degree of recess formed in the ILD 180 may be dependent on the type of semiconductor device 100. For example, the semiconductor device 100 may be an Input/Output (I/O) device. I/O devices include devices that handle the input and/or output voltages/currents, and as such they need to be able to tolerate a greater amount of voltage or current swing than non-I/O devices. In comparison, non-I/O devices may include core devices, which may include logic devices (that do not need to handle the input/output voltages/currents directly). For example, the core devices may include various logic gates such as NAND, NOR, INVERTER, etc. In some embodiments, the core devices include an SRAM (static random-access memory) region.

Figure 8:
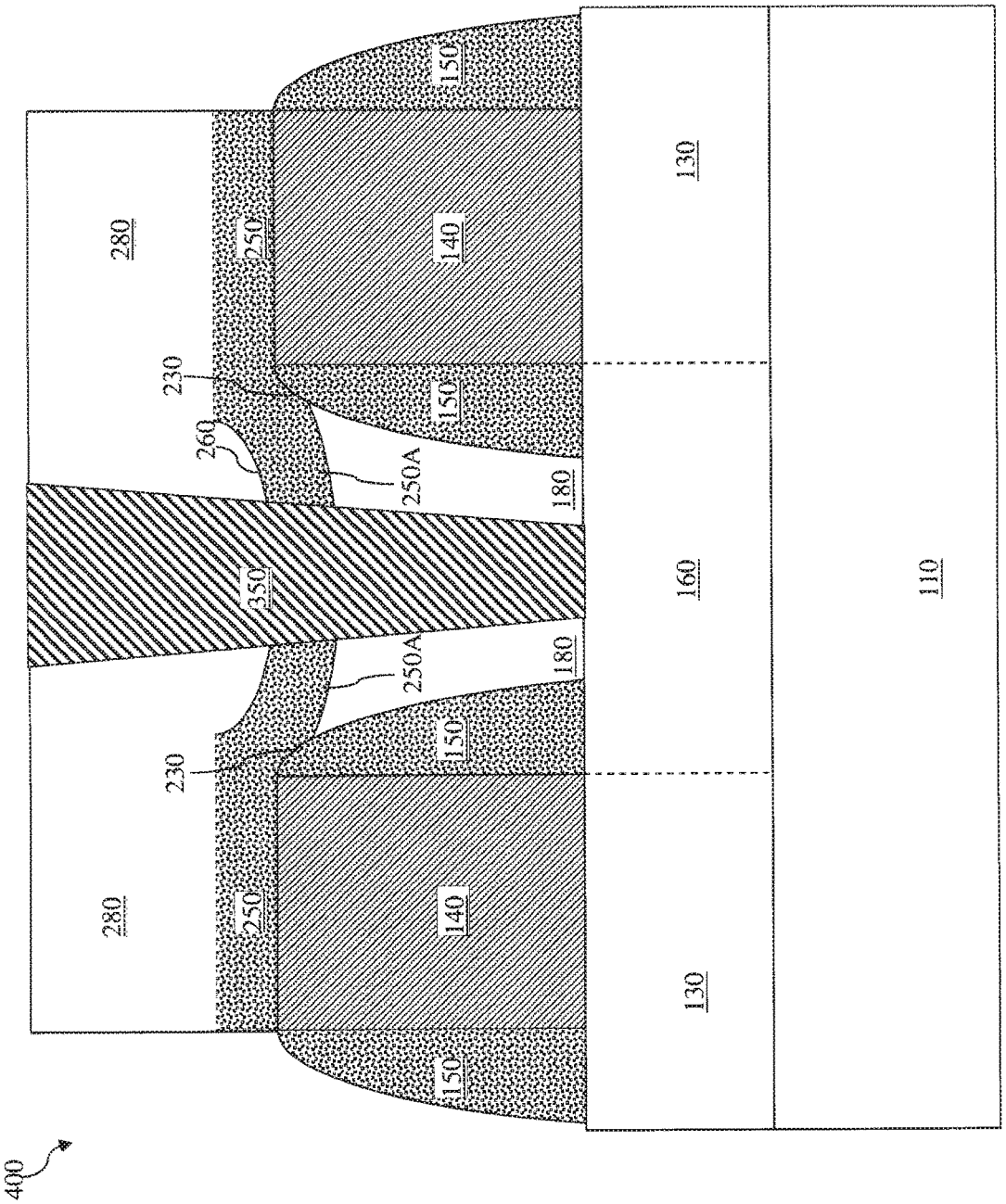

One physical difference between the I/O device and the non-I/O device is that the distance between adjacent gate structures is longer for an I/O device than for a non-I/O device. In other words, the ILD 180 for an I/O device is wider than the ILD for a non-I/O device. For example, FIG. 8 illustrates a semiconductor device 400 that is a non-I/O device (e.g., a core device) but is otherwise similar to the I/O device 100 of FIG. 7. The non-I/O device 400 undergoes substantially similar fabrication processes discussed above with reference to FIGS. 2-7 to form the I/O device 100. Therefore, for reasons of clarity and consistency, similar components will be labeled the same for the non-I/O device 400 of FIG. 8 and for the I/O device 100 of FIG. 7.

In addition to the differences in ILD widths, another difference between the non-I/O device 400 in FIG. 8 and the I/O device 100 in FIG. 7 is that the non-I/O device 400 has a less recessed ILD 180 (and thus a less recessed dielectric layer 250) than the I/O device 100. In some embodiments, the less recessed ILD 180 means that the upper surface of the ILD 180 (or the upper surface 260 of the dielectric layer 250) of the non-I/O device 400 is shallower than the upper surface of the ILD 180 (or the upper surface 260 of the dielectric layer 250) of the I/O device 100. For example, the difference between the ILD depths for the I/O device 100 and the non-I/O device 400 is at least 1 nm. In other embodiments, the less recessed ILD 180 also means that the upper surface of the ILD 180 of the non-I/O device 400 is less curved than the upper surface of the ILD 180 of the I/O device 100. The same may be said about the upper surface 260 of the dielectric layer 250 for the I/O device 100 and the non-I/O device 400.

One reason for the more recessed ILD 180 for the I/O device 100 is that I/O devices need to handle greater amounts of voltage/current, and parasitic capacitance may be a greater concern in that situation. Thus, the more recessed ILD 180 for the I/O device 100 can better alleviate the concerns of parasitic capacitance by making sure that enough dielectric material will be formed on the upper sidewalls of the spacers (due to the more recessed ILD), which effectively thickens the spacer 150 as discussed above.

It is understood that additional fabrication processes may be performed to complete the fabrication of the semiconductor device 100. For example, gate contacts may be formed, and a multi-layered interconnect structure containing a plurality of metal lines and vias may also be formed. The semiconductor device 100 may also undergo packaging and testing processes. For reasons of simplicity, these additional processes are not discussed in detail herein. In addition, though the processes discussed above with reference to FIGS. 1-8 are performed using a FinFET as an example semiconductor device, it is understood that the various aspects of the present disclosure (and their benefits) also apply to "planar" non-FinFET devices as well.

Figure 9:
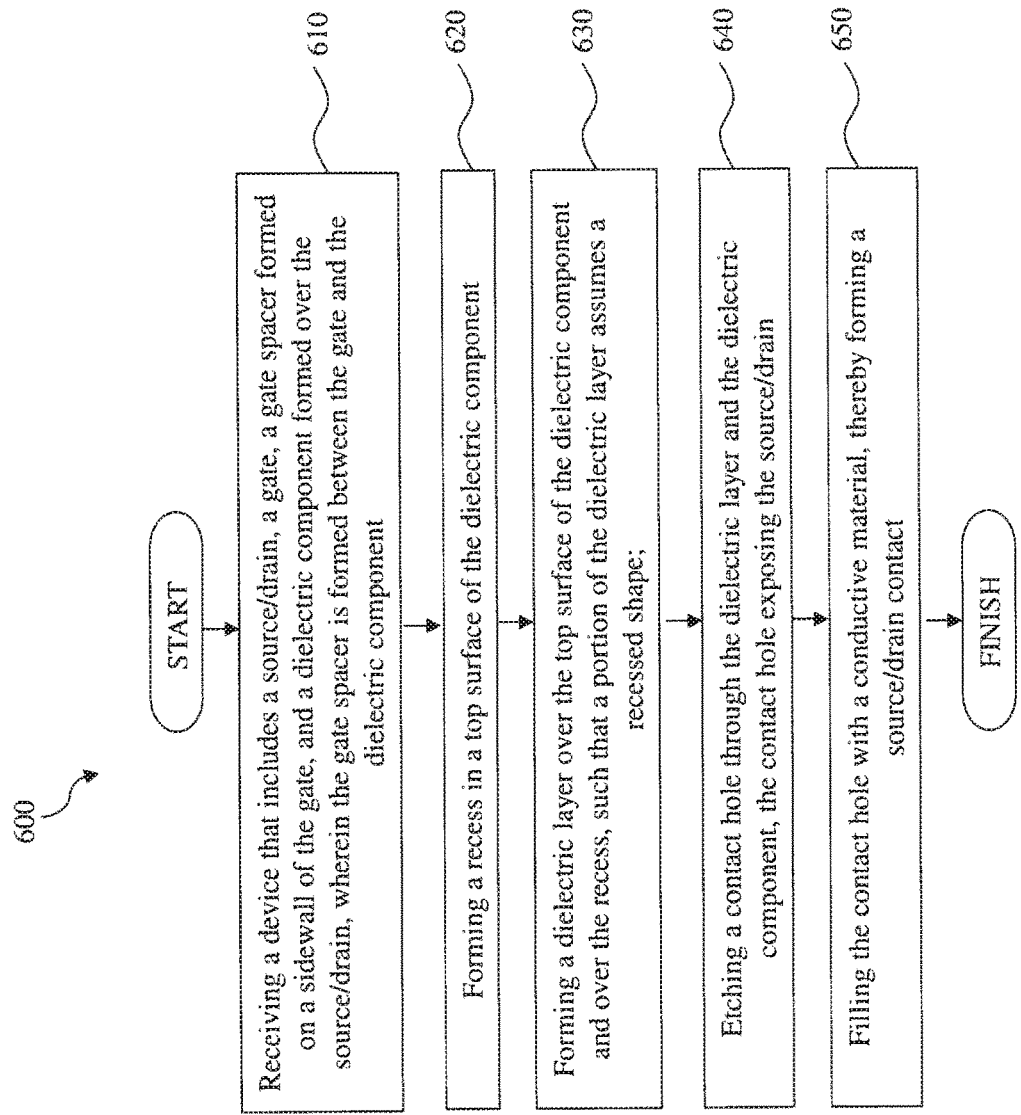
FIG. 9 is a flowchart a method of fabricating a semiconductor device in accordance with embodiments of the present disclosure.

FIG. 9 is a flowchart of a method 600 for fabricating a semiconductor device in accordance with embodiments of the present disclosure. The method 600 includes a step 610 of receiving a device that includes a source/drain, a gate, a gate spacer formed on a sidewall of the gate, and a dielectric component formed over the source/drain. The gate spacer is formed between the gate and the dielectric component. In some embodiments, the receiving of the device comprises receiving a FinFET as the device. The FinFET device includes a fin structure in which the source/drain is formed, and the gate is formed to wrap around the fin structure.

The method 600 includes a step 620 of forming a recess in a top surface of dielectric component. In some embodiments, the forming of the recess comprises performing a chemical-mechanical polishing (CMP) process to the gate and the dielectric component. A slurry of the CMP process is configured such that the dielectric component is polished at a faster rate than the gate. In some other embodiments, the forming of the recess comprises removing portions of the dielectric component via an etching process. The etching process may include a wet etching process or a dry etching process.

The method 600 includes a step 630 of forming a dielectric layer over the top surface of the dielectric component and over the recess, such that a portion of the dielectric layer assumes a recessed shape.

The method 600 includes a step 640 of etching a contact hole through the dielectric layer and the dielectric component, the contact hole exposing the source/drain.

The method 600 includes a step 650 of filling the contact hole with a conductive material, thereby forming a source/drain contact.

In some embodiments, the forming of the recess is performed such that a portion of a sidewall of the gate spacer is exposed, and the forming the dielectric layer is performed such that a portion of the dielectric layer is formed directly on the exposed portion of the sidewall of the gate spacer. The portion of the dielectric layer remains on the sidewall of the gate spacer after the contact hole is etched.

In some embodiments, the receiving the device in step 610 comprises receiving a non-Input/Output (non-I/O) device and an Input/Output (I/O) device that each include their respective source/drain, gate, gate spacer, and dielectric component. The dielectric component of the I/O device is formed to have a greater lateral dimension than the dielectric component of the non-I/O device. In some embodiments, the forming of the recess in step 620 is performed such that the I/O device is formed to have a deeper recess than the non-I/O device.

It is understood that additional process steps may be performed before, during, or after the steps 610-650 discussed above to complete the fabrication of the semiconductor device. For example, the semiconductor device may undergo testing and packaging processes before the fabrication is completed. Other process steps are not discussed herein for reasons of simplicity.

Based on the above discussions, it can be seen that the present disclosure offers advantages over conventional semiconductor devices and the fabrication thereof. It is understood, however, that other embodiments may offer additional advantages, and not all advantages are necessarily disclosed herein, and that no particular advantage is required for all embodiments.

One advantage is that the semiconductor device of the present disclosure can reduce potential damage caused by misalignment between the source/drain and the source/drain contact hole. As discussed above, instead of leaving the ILD planarized, the present disclosure uses etching or carefully tuned polishing processes to make the ILD "caved-in" or recessed. The subsequent deposition of a dielectric layer on the recessed ILD effectively enlarges or thickens the spacers. As a result, the etching processes used to form the source/drain contact holes cannot easily pierce through the "thickened" spacers, and this prevents the gate structures from being damaged.

Along similar lines, another advantage is that the "thickened" spacers can relax the overlay requirements or the etching process loading associated with the formation of the source/drain contact hole. This is because even if there is some lateral shift of the source/drain contact hole, the consequences are unlikely to be disastrous, as the "thickened" spacers formed herein can still adequately protect the gate structures.

Furthermore, the present disclosure also offers the advantage of reducing parasitic capacitance. In the context of the present disclosure, parasitic capacitance is an inverse function of a distance between the gate structure and the source/drain contact. The "thickened" spacers herein ensure that the source/drain contact does not get "too close" to the gate structure on either side. In other words, the "thickened" spacers effectively lengthen a minimum distance between the gate structures and the source/drain contact. As this distance increases, the resulting parasitic capacitance is reduced. The reduction of parasitic capacitance improves yield and enhances semiconductor device performance.

One aspect of the present disclosure involves a semiconductor device. The semiconductor device includes a transistor. The transistor includes a source/drain region, a gate structure, a gate spacer disposed on a sidewall of the gate structure, a first dielectric material disposed adjacent to an upper portion of the gate spacer, and a second dielectric material disposed adjacent to a lower portion of the gate spacer. The second dielectric material and the first dielectric material have different material compositions.

Another aspect of the present disclosure involves a semiconductor device. The semiconductor device includes a non-Input/Output (non-I/O) device. The non-I/O device includes a first source/drain, a first gate structure, a first gate spacer disposed on a sidewall of the first gate structure, a first interlayer dielectric (ILD) disposed next to the first gate spacer, a first dielectric layer disposed over the first gate structure and over the first ILD, the first dielectric layer having a first recessed upper surface, and a first contact disposed over the first source/drain. The first contact extends through the first ILD and the first dielectric layer. The semiconductor device also includes an Input/Output (I/O) device. The I/O device includes a second source/drain, a second gate structure, a second gate spacer disposed on a sidewall of the second gate structure, a second interlayer dielectric (ILD) disposed next to the second gate spacer, a second dielectric layer disposed over the second gate structure and over the second ILD, the second dielectric layer having a second recessed upper surface, and a second contact disposed over the second source/drain. The second contact extends through the second ILD and the second dielectric layer. The second recessed upper surface has a greater depth than the first recessed upper surface.

Yet another aspect of the present disclosure involves a method of fabricating a semiconductor device. A device is received that includes a source/drain, a gate, a gate spacer formed on a sidewall of the gate, and a dielectric component formed over the source/drain. The gate spacer is formed between the gate and the dielectric component. A recess is formed in a top surface of the dielectric component. A dielectric layer is formed over the top surface of the dielectric component and over the recess, such that a portion of the dielectric layer assumes a recessed shape. A contact hole is etched through the dielectric layer and the dielectric component. The contact hole exposes the source/drain.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a transistor that includes:
      a source/drain region,
      a gate structure, and
      a gate spacer disposed on a sidewall of the gate structure;
   a first dielectric material disposed over a top surface of the gate structure and adjacent to an upper portion of the gate spacer;
   a second dielectric material disposed under the first dielectric material and adjacent to a lower portion of the gate spacer, wherein the second dielectric material and the first dielectric material have different material compositions; and
   a conductive contact disposed over the source/drain region, wherein the first dielectric material and the second dielectric material are disposed between the gate spacer and the conductive contact.

2. The semiconductor device of claim 1, wherein the first dielectric material has a recessed upper surface.

3. The semiconductor device of claim 2, wherein:
   the transistor is a first transistor that is a non-Input/Output (non-I/O) device;
   the semiconductor device further comprises a second transistor that is an Input/Output (I/O) device, the I/O device including a source/drain region, a gate structure, a gate spacer, and a first dielectric material disposed adjacent to an upper portion of the gate spacer; and
   the first dielectric material of the I/O device has a more recessed upper surface than the first dielectric material of the non-I/O device.

4. The semiconductor device of claim 1, wherein the first dielectric material includes silicon and nitrogen and the second dielectric material includes silicon and oxygen.

5. The semiconductor device of claim 1, wherein the semiconductor device is a FinFET.

6. The semiconductor device of claim 1, wherein the first dielectric material is disposed directly on the second dielectric material.

7. The semiconductor device of claim 1, wherein a sidewall of the upper portion of the gate spacer is in physical contact with the first dielectric material.

8. The semiconductor device of claim 1, wherein the first dielectric material is a part of an etching-stop layer that is disposed over the gate structure and over the second dielectric material.

9. A semiconductor device comprising:
   a non-Input/Output (non-I/O) device that includes:
      a first source/drain,
      a first gate structure,
      a first gate spacer disposed on a sidewall of the first gate structure,
      a first interlayer dielectric (ILD) disposed next to the first gate spacer,
      a first dielectric layer disposed over a top surface of the first gate structure and over the first ILD, the first dielectric layer having a first recessed upper surface, and
      a first contact disposed over the first source/drain, wherein the first contact extends through the first ILD and the first dielectric layer; and
   an Input/Output (I/O) device that includes:
      a second source/drain,
      a second gate structure,
      a second gate spacer disposed on a sidewall of the second gate structure,
      a second interlayer dielectric (ILD) disposed next to the second gate spacer,
      a second dielectric layer disposed over a top surface of the second gate structure and over the second ILD, the second dielectric layer having a second recessed upper surface, wherein the second recessed upper surface has a greater depth than the first recessed upper surface, and
      a second contact disposed over the second source/drain, wherein the second contact extends through the second ILD and the second dielectric layer.

10. The semiconductor device of claim 9, wherein:
    a first segment of the first dielectric layer is disposed directly on a portion of a sidewall of the first gate spacer; and
    a second segment of the second dielectric layer is disposed directly on a portion of a sidewall of the second gate spacer.

11. The semiconductor device of claim 9, wherein the non-I/O device and the I/O device are FinFET devices.

12. The semiconductor device of claim 9, wherein the second ILD is wider than the first ILD.

13. A semiconductor device comprising:
    a first gate structure and a second gate structure disposed over a semiconductor layer, wherein first spacers are disposed along sidewalls of the first gate structure and second spacers are disposed along sidewalls of the second gate structure;
    a source/drain region disposed in the semiconductor layer between the first gate structure and the second gate structure;
    a first interlevel dielectric layer disposed over the semiconductor layer and between the first spacers and the second spacers, wherein a portion of the first interlevel dielectric layer has a first recessed upper surface;
    a dielectric layer disposed over the first spacers, the second spacers, and the first recessed upper surface of the first interlevel dielectric layer, wherein a portion of the dielectric layer has a second recessed upper surface, wherein the portion of the dielectric layer having the second recessed upper surface is disposed over the portion of the first interlevel dielectric layer having the first recessed upper surface, and further wherein a first distance between a top surface of the semiconductor layer and the second recessed upper surface of the portion of the dielectric layer is greater than a second distance between the top surface of the semiconductor layer and the top surfaces of the first gate structure and the second gate structure;
    a second interlevel dielectric layer disposed over the dielectric layer; and
    a contact that extends through the second interlevel dielectric layer, the dielectric layer, and the first interlevel dielectric layer to the source/drain region.

14. The semiconductor device of claim 13, wherein the dielectric layer is further disposed over the top surfaces of the first gate structure and the second gate structure.

15. The semiconductor device of claim 13, wherein a material of the dielectric layer is different than a material of the first interlevel dielectric layer and a material of the second interlevel dielectric layer.

16. The semiconductor device of claim 15, wherein the material of the first interlevel dielectric layer is the same as the material of the second interlevel dielectric layer.

17. The semiconductor device of claim 15, wherein the material of the dielectric layer is the same as a material of the first spacers and the second spacers.

18. The semiconductor device of claim 13, wherein the dielectric layer is disposed directly on an upper portion of the first spacers and the second spacers, and the first interlevel dielectric layer is disposed directly on a lower portion of the first spacers and the second spacers.

19. The semiconductor device of claim 13, wherein the contact extends through the portion of the first interlevel dielectric layer having the first recessed upper surface and the portion of the dielectric layer having the second recessed upper surface.

20. The semiconductor device of claim 13, wherein the source/drain region is a first source/drain region, the dielectric layer is a first dielectric layer, and the contact is a first contact, and further wherein the semiconductor device further comprises:
- a third gate structure and a fourth gate structure disposed over the semiconductor layer, wherein third spacers are disposed along sidewalls of the third gate structure and fourth spacers are disposed along sidewalls of the fourth gate structure;
- a second source/drain region disposed in the semiconductor layer between the third gate structure and the fourth gate structure;
- a third interlevel dielectric layer disposed over the semiconductor layer and between the third spacers and the fourth spacers, wherein a portion of the third interlevel dielectric layer has a third recessed upper surface;
- a second dielectric layer disposed directly on the third spacers, the fourth spacers, and the third recessed upper surface of the third interlevel dielectric layer, wherein a portion of the second dielectric layer has a fourth recessed upper surface, wherein the portion of the second dielectric layer having the fourth recessed upper surface is disposed over the portion of the third interlevel dielectric layer having the third recessed upper surface;
- a fourth interlevel dielectric layer disposed over the second dielectric layer; and
- a second contact that extends through the fourth interlevel dielectric layer, the second dielectric layer, and the third interlevel dielectric layer to the second source/drain region.

* * * * *